United States Patent
Gao et al.

(10) Patent No.: US 11,227,532 B2
(45) Date of Patent: Jan. 18, 2022

(54) PANEL, MANUFACTURING METHOD THEREOF, AND TERMINAL

(71) Applicants: Chongqing BOE Optoelectronics Technology Co., Ltd., Chongqing (CN); BOE Technology Group Co., Ltd., Beijing (CN)

(72) Inventors: Xianyong Gao, Beijing (CN); Sijun Lei, Beijing (CN); Liang Gao, Beijing (CN); Yansheng Sun, Beijing (CN); Ying Zhang, Beijing (CN); Shanbin Chen, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/640,870

(22) PCT Filed: Jul. 26, 2019

(86) PCT No.: PCT/CN2019/097905
§ 371 (c)(1),
(2) Date: Feb. 21, 2020

(87) PCT Pub. No.: WO2020/020347
PCT Pub. Date: Jan. 30, 2020

(65) Prior Publication Data
US 2020/0355971 A1 Nov. 12, 2020

(30) Foreign Application Priority Data

Jul. 27, 2018 (CN) .......................... 201810848255.1
Jan. 25, 2019 (CN) .......................... 201910071388.7

(51) Int. Cl.
*G02F 1/1333* (2006.01)
*G06F 3/041* (2006.01)
(Continued)

(52) U.S. Cl.
CPC ....... *G09G 3/2096* (2013.01); *G02F 1/13338* (2013.01); *G02F 1/136286* (2013.01);
(Continued)

(58) Field of Classification Search
CPC .... G06F 3/0412; G06F 3/0446; G06F 3/0445; G06F 3/041; G06F 2203/04107;
(Continued)

(56) References Cited

U.S. PATENT DOCUMENTS 7,609,125 B2 * 10/2009 van Quach ............. H01L 23/66
333/238
7,965,367 B2 * 6/2011 Oohira ................. H05K 1/0219
349/150
(Continued)

FOREIGN PATENT DOCUMENTS

CN          1829414 A      9/2006
CN        101295809 A    10/2008
(Continued)

*Primary Examiner* — Dismery Mercedes
(74) *Attorney, Agent, or Firm* — Nath, Goldberg & Meyer; Joshua B. Goldberg

(57) ABSTRACT

The present disclosure provides a panel, a manufacturing method for the same, and a terminal. The panel includes: a base substrate; at least one differential signal line group on the base substrate, each including two signal lines; and at least one ground wire group on the base substrate and on the same side of the base substrate as the at least one differential signal line group. The at least one ground wire group is in one-to-one correspondence with the at least one differential signal line group, each ground wire group includes two ground wires, and orthographic projections of the two
(Continued)

ground wires in each ground wire group on the base substrate are on two sides of an orthographic projection of a corresponding differential signal line group on the base substrate, respectively.

17 Claims, 10 Drawing Sheets

(51) Int. Cl.
| | |
|---|---|
| G02F 1/1362 | (2006.01) |
| H05K 1/02 | (2006.01) |
| H01L 27/32 | (2006.01) |
| H01L 51/56 | (2006.01) |
| G09G 3/20 | (2006.01) |
| H04L 1/00 | (2006.01) |
| H04B 10/2569 | (2013.01) |
| H04L 1/20 | (2006.01) |
| G06F 1/18 | (2006.01) |
| G06F 30/39 | (2020.01) |
| H04L 25/02 | (2006.01) |

(52) U.S. Cl.
CPC ............ *G06F 1/189* (2013.01); *G06F 3/0412* (2013.01); *G06F 30/39* (2020.01); *H01L 27/323* (2013.01); *H01L 27/3276* (2013.01); *H01L 51/56* (2013.01); *H04B 10/2569* (2013.01); *H04L 1/00* (2013.01); *H04L 1/203* (2013.01); *H05K 1/0245* (2013.01); *G06F 2203/04103* (2013.01); *G09G 2310/08* (2013.01); *G09G 2320/06* (2013.01); *G09G 2330/06* (2013.01); *G09G 2370/06* (2013.01); *G09G 2370/08* (2013.01); *G09G 2370/10* (2013.01); *H01L 2223/6638* (2013.01); *H01L 2227/323* (2013.01); *H04L 25/0272* (2013.01); *H05K 2201/09227* (2013.01); *H05K 2201/09727* (2013.01); *H05K 2201/09736* (2013.01)

(58) Field of Classification Search
CPC ........... G06F 2203/04103; G06F 30/39; G06F 30/394; G06F 2115/12; G09G 3/3648; G09G 2300/0426; G09G 2330/06; G02F 1/136286; G02F 1/13338; G02F 1/1333; G02F 1/1345; H01L 27/323; H01L 27/3276; H01L 2223/6638; H01L 51/56; H05K 1/0245; H05K 1/0216; H05K 2201/09227; H05K 2201/09236; H05K 2201/09727; H05K 2201/09736; H05K 3/4623; H04L 25/0272; H04L 1/00
See application file for complete search history.

(56) References Cited

U.S. PATENT DOCUMENTS

| | | | |
|---|---|---|---|
| 8,044,746 B2* | 10/2011 | Blair | H01P 3/006 |
| | | | 333/5 |
| 8,378,223 B1* | 2/2013 | Shiue | H05K 1/0248 |
| | | | 174/250 |
| 9,559,401 B2* | 1/2017 | Kawai | H01P 3/026 |
| 10,108,057 B2* | 10/2018 | Enami | G02F 1/13452 |
| 2004/0037050 A1* | 2/2004 | Nakayama | H05K 1/0219 |
| | | | 361/736 |
| 2006/0197625 A1* | 9/2006 | Kashiwakura | H05K 1/0251 |
| | | | 333/33 |
| 2009/0207367 A1 | 8/2009 | Oohira | |
| 2011/0085100 A1* | 4/2011 | Kim | G02F 1/136286 |
| | | | 349/41 |
| 2015/0085452 A1* | 3/2015 | Chou | H01R 12/79 |
| | | | 361/749 |
| 2016/0335388 A1* | 11/2016 | Hayashi | G06F 30/39 |
| 2018/0088386 A1* | 3/2018 | Enami | G09G 3/3648 |
| 2018/0120616 A1* | 5/2018 | Kanou | G06F 3/0412 |
| 2019/0148316 A1* | 5/2019 | Kubo | H01L 23/15 |
| | | | 257/664 |

FOREIGN PATENT DOCUMENTS

| | | |
|---|---|---|
| CN | 101516160 A | 8/2009 |
| WO | 2018003332 A1 | 1/2018 |

* cited by examiner

PANEL, MANUFACTURING METHOD THEREOF, AND TERMINAL

CROSS-REFERENCE TO RELATED APPLICATIONS

This is a National Phase Application filed under 35 U.S.C. 371 as a national stage of PCT/CN2019/097905, filed Jul. 26, 2019, an application claiming the benefit of Chinese Application No. 201810848255.1, filed Jul. 27, 2018, and Chinese Application No. 201910071388.7, filed Jan. 25, 2019, the content of each of which is hereby incorporated by reference in its entirety.

TECHNICAL FIELD

The present disclosure relates to the application field of electronic technology, and particularly relates to a panel, a manufacturing method for the same, and a terminal.

BACKGROUND

Generally, a display device may include a display panel and a panel driver circuit for driving the display panel. The panel driver circuit may include a timing controller (TCON), a gate driver circuit including a plurality of gate driver chips, and a source driver circuit including a plurality of source driver chips.

As the resolution of a display panel increases, a quantity of data that needs to be transmitted also increases dramatically. In the panel driver circuit, a differential signal line (also referred to as high-speed differential signal line, which has a high data transmission rate) is typically used for transmitting high-speed differential signals.

SUMMARY

The present disclosure provides a panel, a manufacturing method for the same, and a terminal that can improve reliability of signal transmission.

According to one aspect of the present disclosure, there is provided a panel, including:
a base substrate;
at least one differential signal line group on the base substrate, each differential signal line group including two signal lines; and
at least one ground wire group on the base substrate and on the same side of the base substrate as the at least one differential signal line group, wherein the at least one ground wire group is in one-to-one correspondence with the at least one differential signal line group, each ground wire group includes two ground wires, and orthographic projections of the two ground wires in each ground wire group on the base substrate are on two sides of an orthographic projection of a corresponding differential signal line group on the base substrate, respectively.

In some embodiments, a width of each of the two signal lines in each differential signal line group satisfies: S/D is a fixed value,
where D is a gap width between the two signal lines, and S is the width of each of the two signal lines.

In some embodiments, a value of S/D is in the range of $$\left[\frac{F}{2}, \frac{3F}{2}\right],$$

where F is a value greater than 0.1.

In some embodiments, a distance W between any ground wire and a signal line adjacent to the ground wire satisfies:
W is less than or equal to 3S,
where S is a width of the signal line adjacent to the ground wire.

In some embodiments, the at least one differential signal line group includes a plurality of differential signal line groups arranged in an array, the at least one ground wire group includes a plurality of ground wire groups arranged in an array, and any two adjacent ground wire groups share one ground wire.

In some embodiments, the signal lines in the differential signal line group are linear signal lines, and the ground wires in the ground wire group are linear ground wires.

In some embodiments, the signal lines in the differential signal line group are zigzag signal lines, and the ground wires in the ground wire group are zigzag ground wires.

In some embodiments, each signal line in the differential signal line group has a first width S1 at a first segment, a second width S2 at a second segment, and a third width S3 at a third segment in sequence along an overall extending direction of the differential signal line group, wherein the second width S2 is greater than the first width S1 and the third width S3.

In some embodiments, a width of each of the two signal lines in each differential signal line group satisfies: S1/D1=S2/D2=S3/D3;
wherein D1 is a gap width between the two signal lines at the first segment, D2 is a gap width between the two signal lines at the second segment, and D3 is a gap width between the two signal lines at the third segment.

In some embodiments, the at least one differential signal line group and the at least one ground wire group are at a same layer on the base substrate.

In some embodiments, the signal lines in the at least one differential signal line group are signal lines with adjustable widths.

In some embodiments, the panel further includes:
at least one bonding terminal; and
at least one driver chip,
wherein the at least one bonding terminal and the at least one driver chip are connected through the at least one differential signal line group in one-to-one correspondence, and a corresponding ground wire group is arranged between the bonding terminal and the driver chip connected by each differential signal line group.

In some embodiments, each driver chip is provided with one ground terminal and two signal terminals, the ground terminal is at one side of the two signal terminals, the two signal terminals are configured to be coupled to the two signal lines in a corresponding differential signal line group, respectively, and in the ground wire group corresponding to the differential signal line group, one ground wire on the same side of the differential signal line group as the ground terminal is directly coupled to the ground terminal, the other ground wire on a different side of the differential signal line group than the ground terminal is coupled to the ground terminal through a lead wire insulated from both of the two signal lines, and an orthographic projection of the lead wire on the base substrate intersects orthographic projections of the two signal lines on the base substrate.

In some embodiments, the lead wire is on a side of the two signal lines away from the base substrate and lapped on the two signal lines, and an insulating spacer is arranged at a lapping position of the lead wire and the two signal lines.

In some embodiments, the lead wire and the ground wire group are at different layers, an insulating layer is arranged between the lead wire and the ground wire group, one end of the lead wire is coupled to an end of the one ground wire close to the ground terminal through a via hole in the insulating layer, and the other end of the lead wire is coupled to an end of the other ground wire close to the ground terminal through another via hole in the insulating layer.

In some embodiments, each driver chip is provided with two signal terminals and two ground terminals, the two signal terminals are configured to be coupled to the two signal lines in the corresponding differential signal line group, respectively, and the two ground terminals are at two sides of the two signal terminals, respectively, and in the ground wire group corresponding to the differential signal line group, a ground wire and a ground terminal on a same side of the differential signal line group are directly coupled to each other.

In some embodiments, the base substrate is made of a glass or an organic matter.

In some embodiments, the panel is one of a display panel, a touch panel and an in-cell touch display panel.

According to another aspect of the present disclosure, there is provided a terminal including the panel as described above.

According to yet another aspect of the present disclosure, there is provided a manufacturing method for a panel, including:

providing a base substrate; and forming at least one differential signal line group and at least one ground wire group on a same side of the base substrate, wherein the at least one ground wire group is in one-to-one correspondence with the at least one differential signal line group, each differential signal line group includes two signal lines, each ground wire group includes two ground wires, and orthographic projections of the two ground wires in each ground wire group on the base substrate are on two sides of an orthographic projection of a corresponding differential signal line group on the base substrate, respectively.

BRIEF DESCRIPTION OF DRAWINGS

In order to explain embodiments of the present disclosure more clearly, drawings required for description of the embodiments will be briefly illustrated below. Obviously, the drawings described below are merely some embodiments of the present disclosure, and other drawings may be obtained by those skilled in the art based on these drawings without any creative effort.

DETAILED DESCRIPTION

For better clarity of the objects, technical solutions and advantages of the disclosure, the present disclosure will be further described in detail in conjunction with the accompanying drawings. Apparently, the described embodiments are only some, but not all, embodiments of the present disclosure. All other embodiments obtained by the ordinarily skilled in the art based on the embodiments of the present disclosure without any creative effort shall be included in the protection scope of the present disclosure.

With the increasing demand for signal transmission quantity, differential signal lines are more and more widely applied. Current differential signal lines are mainly applied to a display device to transmit signals between two components within the display device.

Currently, part of the differential signal line is located in a bonding area of a base substrate of the display panel, and due to limitations of the manufacturing process of the base substrate, signals transmitted on this part of the differential signal line are easy to be interfered by external signals, leading to poor reliability of signal transmission.

A typical display device includes a panel and a control circuit for the panel, and differential signal lines are configured to transmit corresponding control signals or feedback signals (also called response signals, i.e., signals responsive to the control signals).

Figure 1:
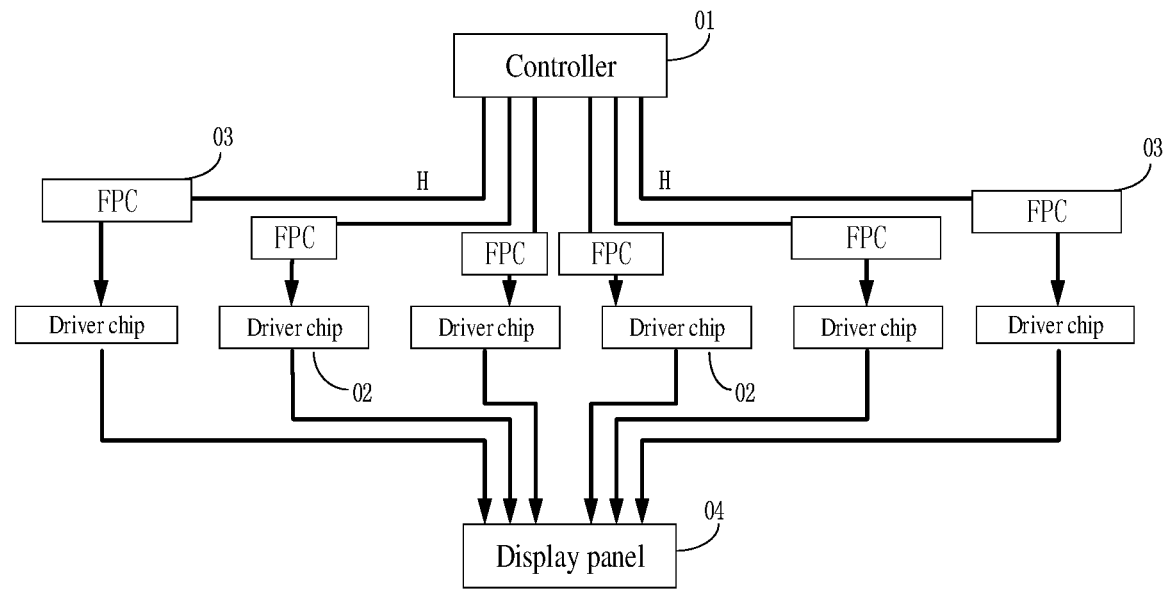
FIG. 1 is a schematic structural diagram illustrating a panel driver circuit according to an exemplary embodiment of the present disclosure.

In a first implementation, the panel is a display panel, and the corresponding control circuit is a panel driver circuit for driving the display panel. The display panel may be an Organic Light-Emitting Diode (OLED) display panel or a Liquid Crystal Display (LCD) panel. The panel driver circuit may include a controller, a gate driver circuit including a plurality of gate driver chips, and a source driver circuit including a plurality of source driver chips. As shown in FIG. 1, a controller 01 is coupled to each driver chip 02 via a Flexible Printed Circuit (FPC) 03, and a differential signal line H is between the controller 01 and each driver chip 02.

The differential signal line H generally includes three segments: a first segment located between the controller 01 and the FPC 03, a second segment located on the FPC 03, and a third segment located between the FPC 03 and the driver chip 02. The first segment is located on a Printed Circuit Board (PCB), the third segment is located on a bonding area of a base substrate of a display panel 04, the FPC 03 is coupled to the driver chip 02 through a bonding terminal (pad), and thus the third segment is a segment between the bonding terminal and the driver chip 02 on the bonding area of the base substrate.

It should be noted that the controller may be any one of a timing controller, a System on Chip (SOC), and a Micro Controller Unit (MCU) integrated in the timing controller, and the driver chip may be a source driver chip.

In a second implementation, the panel is an in-cell touch display panel which is a display panel integrated with a touch function layer (referred to as a touch layer for short), that is, having a structure in which the touch function layer is embedded in pixels of the display panel, and the display panel may be an OLED display panel or an LCD panel.

On one hand, for the connection between the display panel and the controller in the in-cell touch display panel, reference may be made to the first implementation, and a segment of the differential signal line arranged between the controller and each driver chip is located on the base substrate of the display panel. For example, a segment of the differential signal line arranged between the timing controller and each driver chip is located on the base substrate of the display panel. The driver chip may be a source driver chip.

Figure 2:
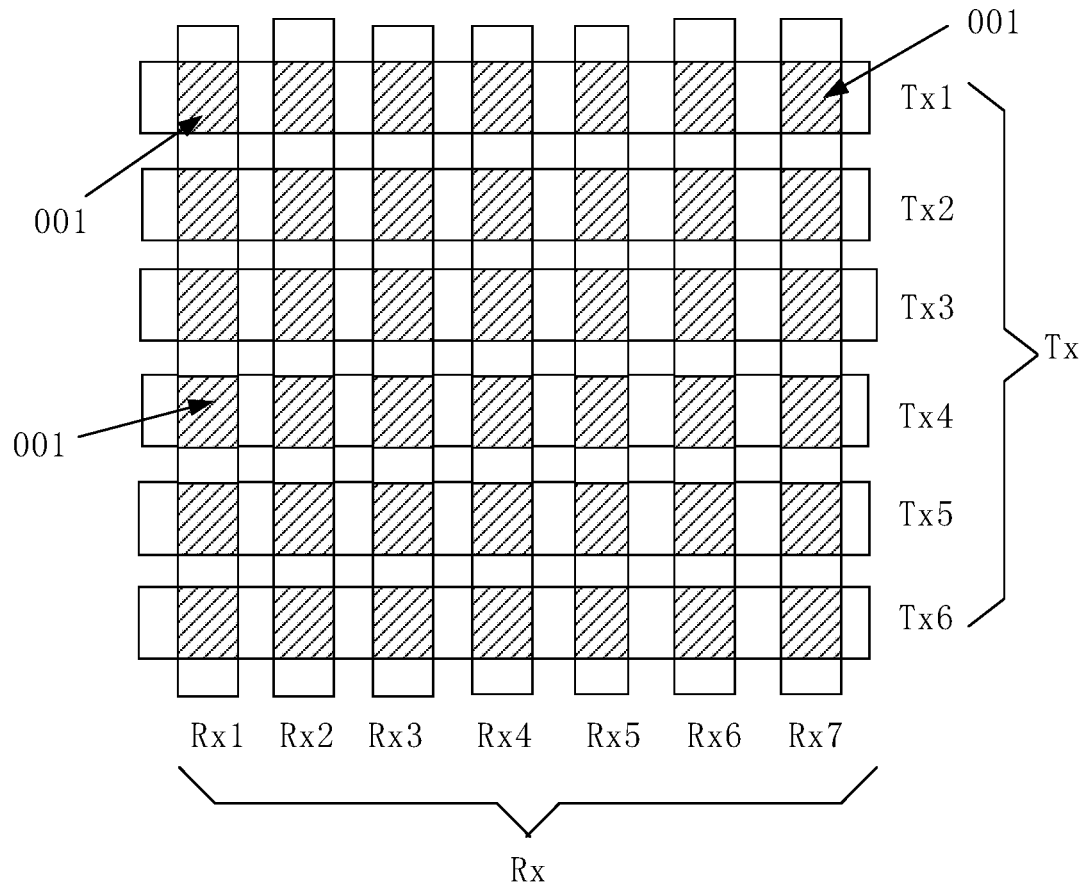
FIG. 2 is a schematic structural diagram illustrating a mutual capacitance touch function layer according to an exemplary embodiment of the present disclosure.

On the other hand, the touch function layers of the in-cell touch display panel are divided into mutual capacitance touch function layers and self-capacitance touch function layers according to the touch principle. As shown in FIG. 2, the mutual capacitance touch function layer includes a plurality of touch units 001 arranged in an array, and the touch function layer includes a plurality of touch driving lines Tx arranged in a transverse direction (i.e., a row direction of the panel) and a plurality of touch sensing lines Rx arranged in a longitudinal direction (i.e., a column direction of the panel). Each of the touch driving lines Tx corresponds to one row of touch units, and each of the touch sensing lines Rx corresponds to one column of touch units. It should be noted that seven touch sensing lines Rx and six touch driving lines Tx are illustrated in FIG. 2 as an example, the number of the touch sensing lines Rx and the number of the touch driving lines Tx are not limited herein.

When the touch function is implemented by a mutual capacitance touch function layer, touch scanning signals are sequentially input to the touch driving lines Tx of the mutual capacitance touch function layer, sensing signals on each touch sensing line Rx are collected, and a position of a touch point is determined according to the sensing signals on each touch sensing line Rx. The touch function may be implemented by a touch driving integrated circuit (IC), that is, the touch driving IC may be configured to input touch scanning signals, collect sensing signals, and determine a position of a touch point. In an exemplary embodiment of the present disclosure, a differential signal line may be between the touch driving IC and each of the touch driving line Tx and touch sensing line Rx for transmission of touch data, and a portion of the differential signal line may pass through a base substrate of the display panel.

For the mutual capacitance touch function layer, in an embodiment, another differential signal line may be further between the controller and a designated driver chip. Each designated driver chip may have a return function, which means a function of transmitting data acquired by the designated driver chip to the controller, and may be coupled to at least one touch sensing line Rx (for example, each designated driver chip with the return function may be coupled to a group of touch sensing lines, and each group of touch sensing lines includes at least two adjacent touch sensing lines). The designated driver chip shares partial functionality of the touch driving IC. In another embodiment, each designated driver chip with the return function may be coupled to the touch driving IC. In this case, the designated driver chip implements fast return of data from the touch driving IC to the controller. The designated driver chip may be a source driver chip or a gate driver chip, and a portion of the differential signal line may pass through a base substrate of the display panel.

Figure 3:
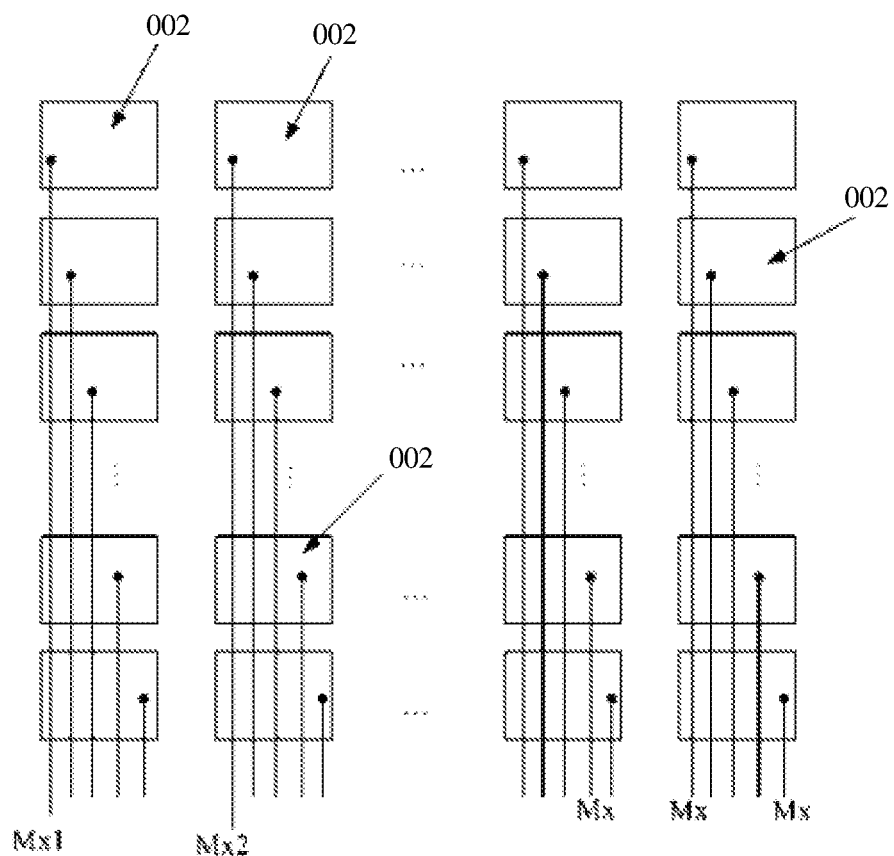
FIG. 3 is a schematic structural diagram illustrating a self-capacitance touch function layer according to an exemplary embodiment of the present disclosure.

As shown in FIG. 3, the self-capacitance touch function layer is typically formed of a single layer of Indium Tin Oxide (ITO), and includes a plurality of touch units 002 arranged in an array, each of which is coupled to one touch line Mx, that is, each touch line Mx corresponds to one of the touch units.

When the touch function is implemented by a self-capacitance touch function layer, touch scanning signals may be simultaneously input to the touch lines Mx at the self-capacitance touch function layer while a sensing signal on each touch line Mx is collected, and a position of a touch point may be determined based on whether the sensing signal on each touch line Mx is the same as a normal sensing signal. The touch function may be implemented by a touch driving integrated circuit (IC), that is, the touch driving IC may be configured to input touch scanning signals, collect sensing signals, and determine a position of a touch point. In an exemplary embodiment of the present disclosure, a differential signal line may be between the touch driving IC and each touch line Mx for transmission of touch data, and a portion of the differential signal line may pass through a base substrate of the display panel.

For the self-capacitance touch function layer, in an embodiment, another differential signal line may be further between the controller and a designated driver chip. Each designated driver chip may have the return function, and each designated driver chip with the return function may be coupled to at least one touch line Mx (for example, each designated driver chip with the return function may be coupled to a group of touch lines, and each group of touch lines includes at least two adjacent touch lines). The designated driver chip then shares partial functionality of the touch driving IC. In another embodiment, each designated driver chip with the return function may be coupled to the touch driving IC. In this case, the designated driver chip implements fast return of data between the controller and the touch driving IC.

It should be noted that the touch function layer in the in-cell touch display panel may be reused as the display function layer in the display panel. For example, in the case that the display panel is an OLED display panel in which the display function layer is implemented based on an OLED, when the touch function layer is a mutual capacitance touch function layer, at least one of the layer where the touch sensing lines are located and the layer where the touch driving lines are located is reused as an electrode layer, which may be one of a cathode layer and an anode layer, of the OLED; and when the touch function layer is a self-capacitance touch function layer, the layer where the touch lines are located is reused as an electrode layer, which may be one of a cathode layer and an anode layer, of the OLED.

In the case that the display panel is an LCD panel in which the display function layer is implemented based on a liquid crystal layer and by a pixel electrode layer and a common electrode layer controlling the liquid crystal layer, when the touch function layer is a mutual capacitance touch function layer, at least one of the layer where the touch sensing lines are located and the layer where the touch driving lines are located is reused as an electrode layer, which may be one of the pixel electrode layer and the common electrode layer, of the display function layer; and when the touch function layer is a self-capacitance touch function layer, the layer where the touch lines are located is reused as an electrode layer, which may be one of the pixel electrode layer and the common electrode layer, of the LCD.

It should be noted that after the touch function layer in the in-cell touch display panel is reused as the display function layer in the display panel, the touch function layer and the display function layer are driven in a time-dividing manner, which ensures that the two function layers do not interfere with each other.

In a third implementation, the panel is a touch panel. Touch panels may be divided into mutual capacitance touch panels and self-capacitance touch panels according to the touch principle. For the structure of the mutual capacitance touch panel, reference may be made to the structure of the mutual capacitance touch function layer in the second implementation. A differential signal line may be between the touch driving IC and each of the touch driving line Tx and the touch sensing line Rx for transmission of touch data, and a portion of the differential signal line may pass through a base substrate of the touch panel. For the structure of the self-capacitance touch panel, reference may be made to the structure of the self-capacitance touch function layer in the second implementation. A differential signal line may be between the touch driving IC and each touch line Mx to transmit touch data, and a portion of the differential signal line may pass through a base substrate of the touch panel.

The above three implementations are only schematic description of the scenario where the differential signal line is located on the base substrate of the panel, and the differential signal line may also be on the base substrate of the panel in other forms. However, due to limitations of the manufacturing process of the base substrate, signal transmission on the differential signal line on the base substrate is easy to be interfered by external signals, leading to poor reliability of signal transmission.

Figure 4:
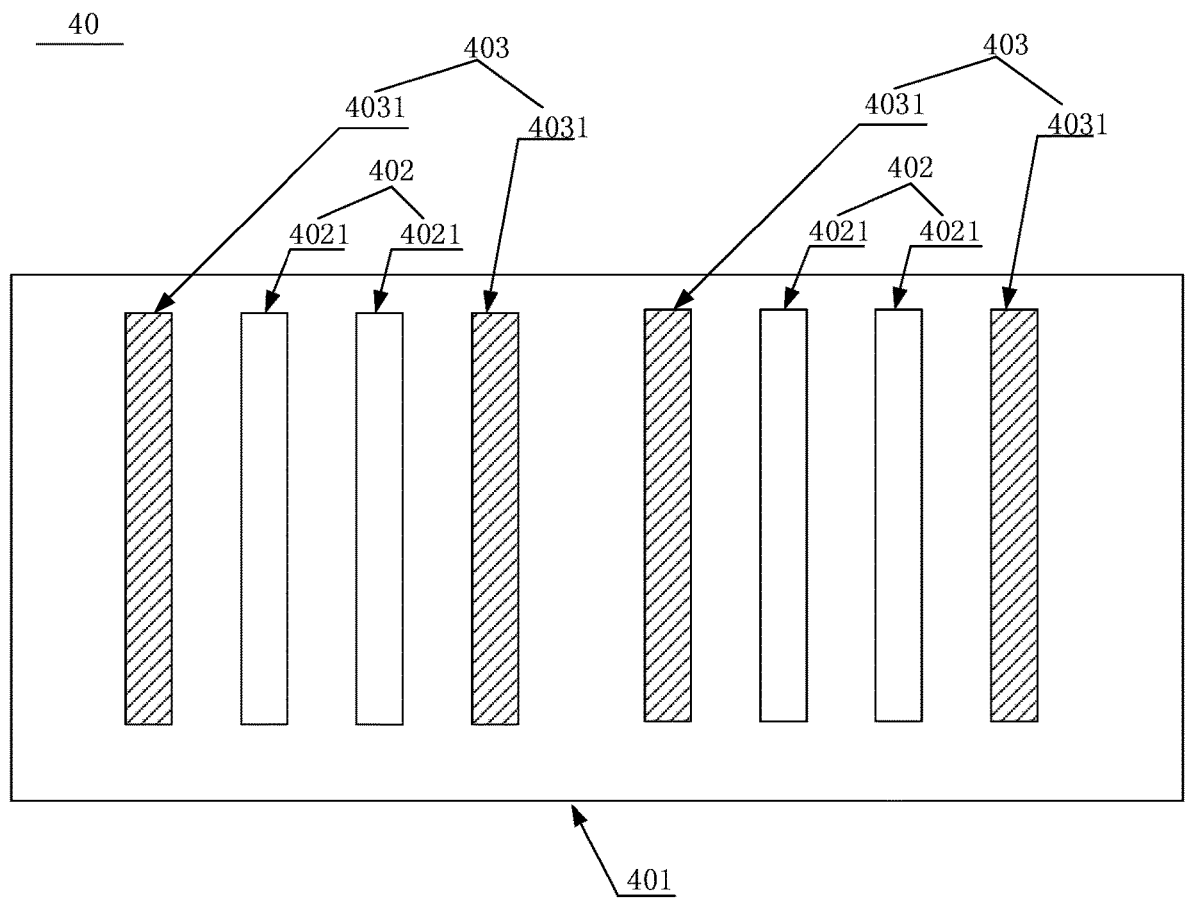
FIG. 4 is a schematic structural diagram illustrating a panel according to an exemplary embodiment of the present disclosure.

In an exemplary embodiment of the present disclosure, there is provided a panel 40, which may be any one of the above-mentioned panels or other panel having a differential signal line group on the base substrate. FIG. 4 is a schematic top view of the panel 40. As shown in FIG. 4, the panel 40 may include a base substrate 401, at least one differential signal line group 402, and at least one ground wire group 403.

In an exemplary embodiment of the present disclosure, the base substrate 401 may be a transparent base substrate made of a glass or an organic matter.

In an exemplary embodiment of the present disclosure, the at least one differential signal line group 402 is on the base substrate 401, and each differential signal line group 402 includes two signal lines 4021.

In an exemplary embodiment of the present disclosure, the at least one ground wire group 403 is on the base substrate 401 and on the same side of the base substrate 401 as the at least one differential signal line group 402, the at least one ground wire group 403 is in one-to-one correspondence with the at least one differential signal line group 402, each ground wire group 403 includes two ground wires 4031, and orthographic projections of the two ground wires 4031 in each ground wire group 403 on the base substrate are respectively located on two sides of an orthographic projection of a corresponding differential signal line group 402 on the base substrate. The ground wire herein is a wire coupled to the ground, a housing or a component with zero reference potential. It should be understood that the term "orthographic projection" means that the at least one differential signal line group and the at least one ground wire group may be located at the same layer or different layers, and as long as the orthographic projections of the two ground wires in the ground wire group on the base substrate are respectively located on two sides of the orthographic projections of the two signal lines in the corresponding differential signal line group on the base substrate within an appropriate distance range, the interference from external signals can be effectively reduced.

In the panel provided in the exemplary embodiment of the present disclosure, at least one ground wire group and at least one differential signal line group in one-to-one correspondence are on the base substrate, each ground wire group includes two ground wires, orthographic projections of the two ground wires in each ground wire group on the base substrate are respectively located on two sides of an orthographic projection of a corresponding differential signal line group on the base substrate (as shown in FIG. 4, the orthographic projections of the two ground wires 4031 on the base substrate 401 are located on two sides of the orthographic projections of the two signal lines 4021 on the base substrate 401), and in this way, interference shielding of signals is performed on the differential signal line group by the ground wires (when there are a plurality of differential signal line groups, crosstalk between the differential signal line groups can also be shielded), thereby effectively reducing external signal interference, and thus improving signal transmission reliability of the differential signal line group.

In an exemplary embodiment of the present disclosure, an overall extending direction of each ground wire group coincides with an overall extending direction of a corresponding differential signal line group. The overall extending direction of the ground wire group refers to a direction from one end to the other end of the ground wire group, and the overall extending direction of the differential signal line group refers to a direction from one end to the other end of the differential signal line group. The overall extending direction of each ground wire group coinciding with the overall extending direction of the corresponding differential signal line group means that the two overall extending directions are parallel or nearly parallel to each other. For example, if the overall extending direction of the differential signal line group is from left to right, the overall extending direction of the corresponding ground wire group is also from left to right, and if the overall extending direction of the differential signal line group is from top to bottom, the overall extending direction of the corresponding ground wire group is also from top to bottom.

Figure 5:
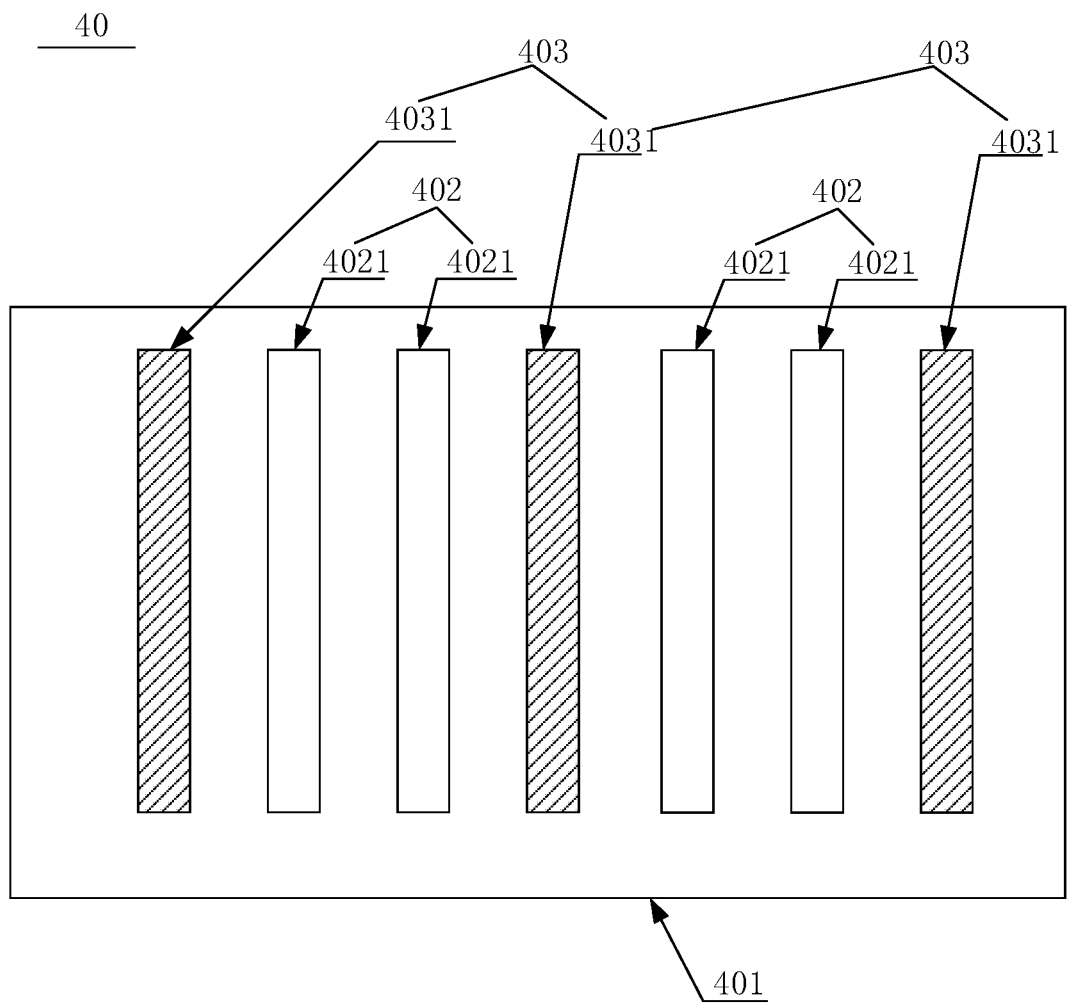
FIG. 5 is a schematic structural diagram illustrating another panel according to an exemplary embodiment of the present disclosure.

In practical implementations, the at least one differential signal line group 402 in the display panel includes a plurality of differential signal line groups arranged in an array, and the at least one ground wire group 403 includes a plurality of ground wire groups arranged in an array. FIG. 4 illustrates a case where each of every (or any) two adjacent ground wire groups includes two ground wires (i.e., two ground wires 4031 are provided between two differential signal line groups 402). In another implementation, as shown in FIG. 5, every two adjacent ground wire groups 403 share (i.e., commonly use) a same ground wire (i.e., only one ground wire 4031 is provided between two differential signal line groups 402). In this way, interference signals, particularly crosstalk between the differential signal line groups can be effectively shielded while reducing the number of ground wires and the manufacturing difficulty.

Figure 6:
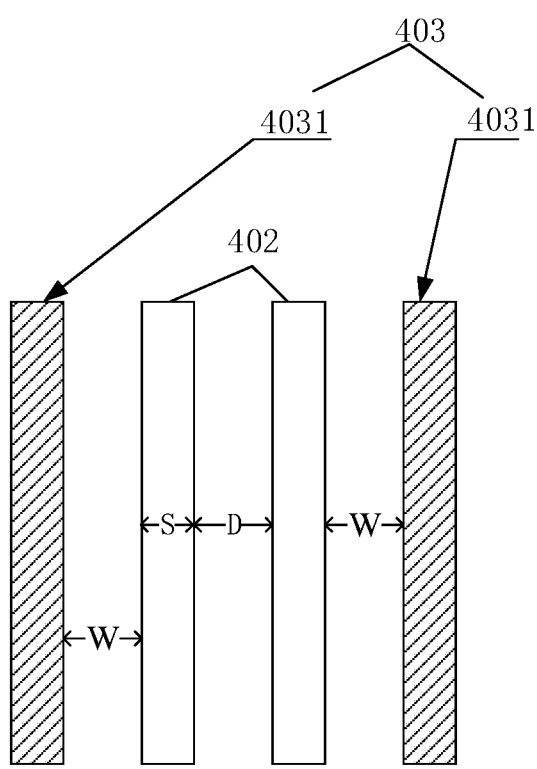
FIG. 6 is a schematic diagram illustrating distances between ground wires and signal lines in a panel according to an exemplary embodiment of the present disclosure.
Figure 7:
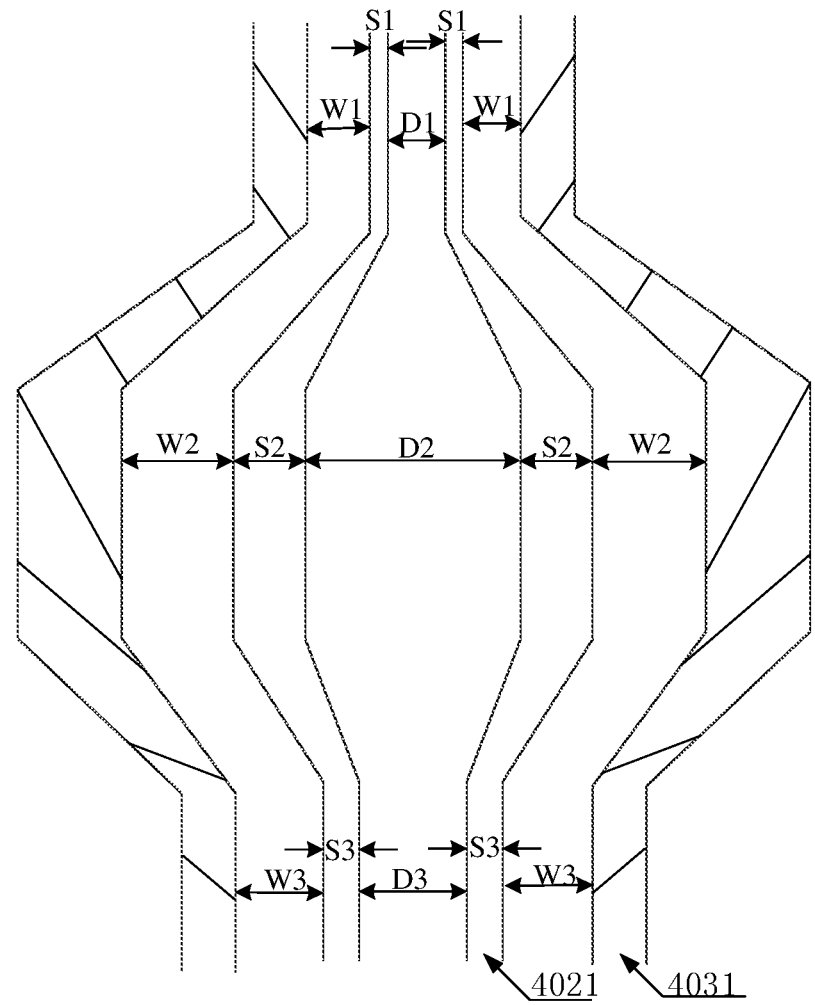
FIG. 7 is a schematic diagram illustrating distances between ground wires and signal lines in another panel according to an exemplary embodiment of the present disclosure.

In the exemplary embodiments of the present disclosure, the differential signal line group has different shapes in different usage scenarios, and to achieve a better shielding effect, the ground wire group has correspondingly different shapes. FIGS. 6 and 7 respectively illustrate the position relationship of the differential signal line group and the ground wire group, and the distances between the ground wires and the signal lines when the signal lines in the differential signal line group are respectively linear signal lines and zigzag signal lines.

As shown in FIG. 6, when the signal lines in the differential signal line group are linear signal lines, the ground wires in the ground wire group are linear ground wires.

As shown in FIG. 7, when the signal lines in the differential signal line group are zigzag signal lines, the ground wires in the ground wire group are zigzag ground wires. FIG. 7 illustrates example structures of one differential signal line group and a corresponding ground wire group. Assuming that the one differential signal line group is any one of the at least one differential signal line group, then the one differential signal line group and the corresponding ground wire group have the position relationship and the dimension relationship as shown in FIG. 7.

In an embodiment, each signal line in the one differential signal line group has a first width S1 at a first segment, a second width S2 at a second segment, and a third width S3 at a third segment in sequence along an overall extending direction of the one differential signal line group. The second width S2 is greater than the first width S1 and the third width S3. Apparently, FIG. 7 is only a schematic illustration, and in practical implementations, the differential signal line group may be shaped to other zigzag shapes according to the positions to be avoided or other actual scenarios, while the corresponding ground wire group may also be shaped to other zigzag shapes. For example, each signal line in the first differential signal line group has two widths or more than four widths in sequence along the overall extending direction of the first differential signal line group, which is not limited herein. It should also be understood that the first, second and third segments described above refer to linear segments of the signal lines, but in fact, there are other segments with gradually changing widths between the first and second segments, and between the second and third segments.

Figure 8:
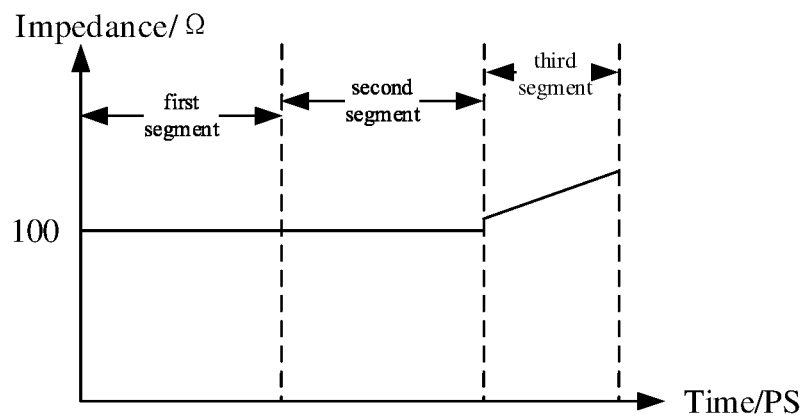
FIG. 8 is a schematic diagram illustrating changes in impedance of different segments of a signal line over time according to an exemplary embodiment of the present disclosure.

For a differential signal line for signal transmission, it is necessary to control the impedance (also referred to as characteristic impedance) thereof. Considering cost, electrical performance, and other factors, the impedance of the differential signal line currently used in the industry is usually set to be less than or equal to 100 ohms (Ω) to ensure efficient transmission of signals. However, differential signal lines on the base substrate generally cannot satisfy this requirement for the characteristic impedance. By taking the differential signal line H in FIG. 1 as an example, FIG. 8 is a schematic diagram illustrating impedance in three segments of the differential signal line H, in which the horizontal axis represents time in picoseconds (PS), and the vertical axis represents impedance in ohms. The schematic diagram reflects the change in impedance of different segments of the differential signal line over time. As shown in FIG. 8, the first segment between the controller and the FPC and the second segment on the FPC each have impedance of less than or equal to 100 ohms, while the third segment between the FPC and the driver chip has impedance greater than 100 ohms due to its placement on the base substrate. The current differential signal lines on the base substrate cannot satisfy the requirement of having an impedance less than or equal to 100 ohms mainly due to process limitations. For example, as the demand for narrow bezel of the panel increases, the signal lines cannot be made very wide under the limitation of the bezel of the panel, which makes the signal lines susceptible to interference.

In an exemplary embodiment of the present disclosure, in the case that the positions of the differential signal line group and the ground wire group in the panel satisfy certain conditions, a better anti-interference effect can be achieved.

It is assumed that a gap width between two signal lines at a measurement position is D, a width of each signal line at the measurement position is S, and a distance between any ground wire and a signal line adjacent thereto at the measurement position is W, a connecting line between the two signal lines at the measurement position is perpendicular to an overall extending direction of the differential signal line group where the two signal lines are located, the measurement position of the first signal line is a position where any cross section perpendicular to the overall extending direction of the differential signal line group where the first signal line is located intersects the first signal line, and the adjacent signal line is a signal line, closest to the any ground wire, in a differential signal line group corresponding to the ground wire group where the any ground wire is located.

Based on this, the characteristic impedance $Z_{diff}$ of the signal line on the base substrate may be derived through the microwave theory.

In an exemplary embodiment of the present disclosure, the characteristic impedance on the panel is mainly related to W, D and S. Generally, whether the impedance value of the differential signal line group is a target value may be verified in ANSYS software based on lamination information of the respective film layers on the panel, sheet resistance of a conductive layer, a dielectric constant of a non-conductive layer, parameters of the layout of the differential signal line group (including the shape of the differential signal line group, parameters such as W, D and S as described above, etc.), and the like.

Figure 9:
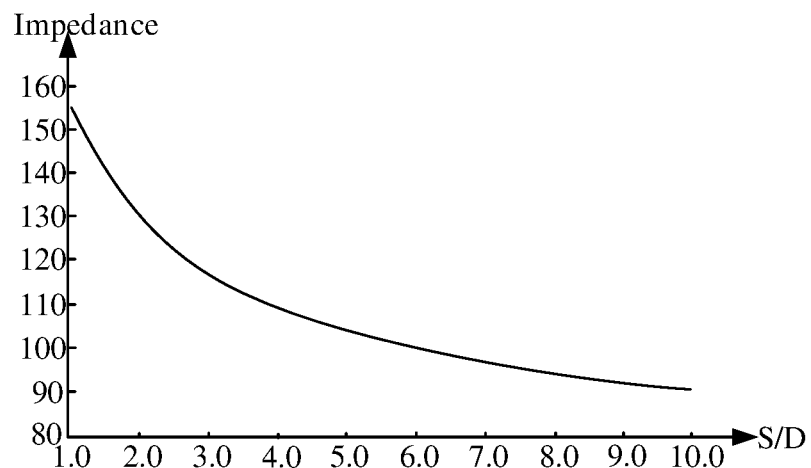
FIG. 9 is a schematic diagram illustrating the relationship between S/D and impedance.

Based on this, by adjusting values of W, D and S, values of W, D and S that make the impedance satisfy the target value may be verified. In FIG. 6, it is assumed that W, D and S of the panel have fixed values, and W, D and S at any position thus have fixed values. The manufacturing process of the differential signal line group and the ground wire group is simpler when W, D and S have fixed values. Considering that different panel products have different bezel sizes, the requirement of always maintaining fixed values of W, D and S may not be satisfied. As shown in FIG. 9, FIG. 9 is a graph illustrating a relationship between impedance of the differential signal line group and S/D according to some exemplary embodiments of the present disclosure. This graph is a schematic characteristic curve obtained by simulating different panel products, in which the horizontal axis represents a value of S/D (where S is a width of a signal line at a measurement position, and D is a gap width between two signal lines at the measurement position), and the vertical axis represents impedance in ohms. As can be seen from FIG. 9, the value of S/D has a greater influence on impedance, and S/D has a negative correlation with impedance, that is, the greater the S/D, the smaller the impedance.

Therefore, in actual design of the differential signal line group, the value of S/D may be set according to the bezel requirements of different panels, for example, S/D>0.1 at a same position. A connecting line between two signal lines in the differential signal line group at the same position is perpendicular to the overall extending direction of the differential signal line group where the two signal lines are located.

Figure 10:
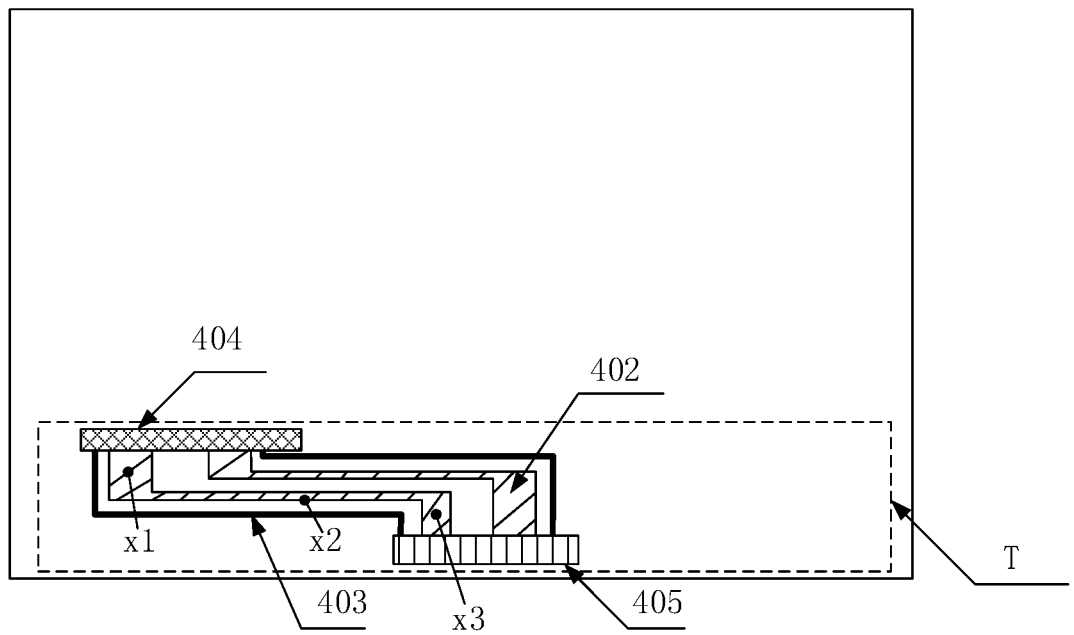
FIG. 10 is a schematic structural diagram illustrating a panel according to an exemplary embodiment of the present disclosure.

Further, as shown in FIG. 10, FIG. 10 is a schematic structural diagram of a panel 40. In a bonding area T of the panel, a bonding terminal 404 is coupled to a driver chip 405 through a differential signal line group. In order to reduce a width of the bonding area T to implement a narrow bezel of the panel, the signal lines in the differential signal line group 402 may be configured to have an adjustable width, and S/D on the differential signal line group has a fixed value so that impedance of the differential signal line group is stable, and an influence of the differential signal line group on signal transmission is reduced. The width-adjustable signal lines may include a first linear segment x1, a second linear segment x2 and a third linear segment x3 which are connected in sequence. The first linear segment x1 is parallel to the third linear segment x3, and widths of the first linear segment x1 and the third linear segment x3 may be set to be wider. In addition, considering the requirement of a narrow bezel, a width of the second linear segment x2 may be set to be narrower. That is, the width of the second linear segment x2 is smaller than the widths of the first linear segment x1 and the third linear segment x3, while S/D throughout the signal line remains a fixed value. It should be noted that FIG. 10 schematically illustrates the wiring of the bonding area by taking an example in which one bonding terminal 404 and one driver chip 405 are connected through one differential signal line group. In practical implementations, the bonding area may be provided with a plurality of bonding terminals, a plurality of driver chips, and a plurality of differential signal line groups.

In an exemplary embodiment of the present disclosure, in order to simplify the manufacturing process of the differential signal line group, S/D has the same fixed value at respective positions. As shown in FIG. 7, S1/D1=S2/D2=S3/D3, where D1 is a gap width at a position where the two signal lines have a first width S1 (i.e., the first segment); D2 is a gap width at a position where the two signal lines have a second width S2 (i.e., the second segment); and D3 is a gap width at a position where the two signal lines have a third width S3 (i.e., the third segment). It should be noted that in FIG. 7, three segments having widths S1, S2, and S3 in one of the two signal lines in the differential signal line group are respectively parallel to those in the other of the two signal lines in the differential signal line group, and the gap widths between the two signal lines are D1, D2, and D3 at the three segments, respectively. Since the gap width between the two parallel signal lines remains constant at the corresponding segment, for the convenience of viewing, the corresponding width S1 and gap width D1 in FIG. 7 are not indicated at the same position, and similarly, the width S3 and the gap width D3 are not indicated at the same position.

The position relationship of the differential signal line group and the ground wire group may further satisfy at least one of the following two conditions, and when the two conditions are both satisfied, the anti-interference capability of the differential signal line group is better than that when only one of the two conditions is satisfied.

First condition: as can be seen from FIG. 9, the value of S/D has a greater influence on impedance, and in order to obtain the impedance satisfying the condition, the width S of each of the two signal lines in each differential signal line group at the measurement position satisfies:

the value of S/D is in the range of $$\left[\frac{F}{2}, \frac{3F}{2}\right],$$

where F is a value greater than 0.1. The value F is an ideal ratio S/D obtained by software simulation or experimental calculation, and the actually-used S/D is generally 50% to 150% of the value F.

D is the gap width of the two signal lines at the measurement position, and a connecting line between the two signal lines at the measurement position is perpendicular to an overall extending direction of the differential signal line group where the two signal lines are located. As can be seen from the graph shown in FIG. 9, in this scenario, the ideal ratio S/D may be 8, and then the value of S/D is in the range of [4,12] so that the impedance of the differential signal line group is about 100 ohms, and effective transmission of signals is ensured. For example, the value of S/D may be 4, 8, or 12.

In addition, as shown in FIG. 6, since S and D have fixed values, the value of S/D of the differential signal line group shown in FIG. 6 is in the range of $$\left[\frac{F}{2}, \frac{3F}{2}\right]$$

at any position, where F is a value greater than 0.1. As shown in FIG. 7, since S and D have fixed values at the three segments, respectively, the differential signal line group shown in FIG. 7 can satisfy S1/D1=S2/D2=S3/D3, and each of S1/D1, S2/D2 and S3/D3 is in the range of $$\left[\frac{F}{2}, \frac{3F}{2}\right],$$

where F is a value greater than 0.1.

Second condition: since for each ground wire, the farther the distance from the signal lines in the corresponding differential signal line group, the poorer the interference shielding effect for the differential signal line group, it is necessary to ensure that each ground wire has an appropriate distance from the signal lines in the corresponding differential signal line group. For this reason, in each ground wire group, the distance W between any ground wire and a signal line adjacent thereto at the measurement position satisfies:

W is less than or equal to 3S; where S is a width of a first signal line at the measurement position, the measurement position of the adjacent signal line is a position where any cross section perpendicular to the overall extending direction of the differential signal line group where the first signal line is located intersects the first signal line, and the adjacent signal line is a signal line closest to the any ground wire in a differential signal line group corresponding to the ground wire group where the any ground wire is located.

In addition, as shown in FIG. 6, since S and D have fixed values, the differential signal line group shown in FIG. 6 satisfies W≤3S at any position. As shown in FIG. 7, since S and W have fixed values at the three segments, respectively, the differential signal line group shown in FIG. 7 satisfies $W1 \leq 3S1$, $W2 \leq 3S2$, and $W3 \leq 3S3$. For the two signal lines in the differential signal line group and the corresponding ground wire group, the three segments with the widths S1, S2 and S3 of one of the two signal lines are parallel to those of the other of the two signal lines, respectively, and the distances between the ground wire and the signal line are W1, W2 and W3 at the three segments respectively. Since the distance between the ground wire and the signal line parallel to each other is the same at the corresponding segment, for the convenience of viewing, the corresponding width S1 and distance W1 in FIG. 7 are not indicated at the same position, and similarly, the width S3 and the distance W3 are not indicated at the same position.

It should be noted that the position relationship between the differential signal line group and the corresponding ground wire group and the distances between the ground wires and the signal lines shown in FIGS. 6 and 7 are merely schematic illustrations, and in practical implementations, other position relationship and distances between the ground wires and the signal lines are possible. The interference of external signals can be effectively reduced as long as at least one of the above two conditions is satisfied.

In an exemplary embodiment of the present disclosure, the at least one differential signal line group 402 and the at least one ground wire group 403 are located at the same layer on the base substrate 401. In this way, the ground wire group and the differential signal line group are located on the same horizontal plane, and the differential signal line group is actually surrounded by the corresponding ground wire group in physical location to effectively shield interference signals. In an exemplary embodiment of the present disclosure, if the differential signal line group on the base substrate is a differential signal line group of a whole segment, each ground wire in the corresponding ground wire group is also a ground wire of a whole segment; and if the differential signal line group on the base substrate is a differential signal line group having multiple segments located at different layers, each ground wire in the corresponding ground wire group is also a ground wire having multiple segments at different layers, and the multiple segments of the signal line are in one-to-one correspondence with the multiple segments of the ground wire, and corresponding segments of the signal line and the ground wire are at the same layer.

Figure 11:
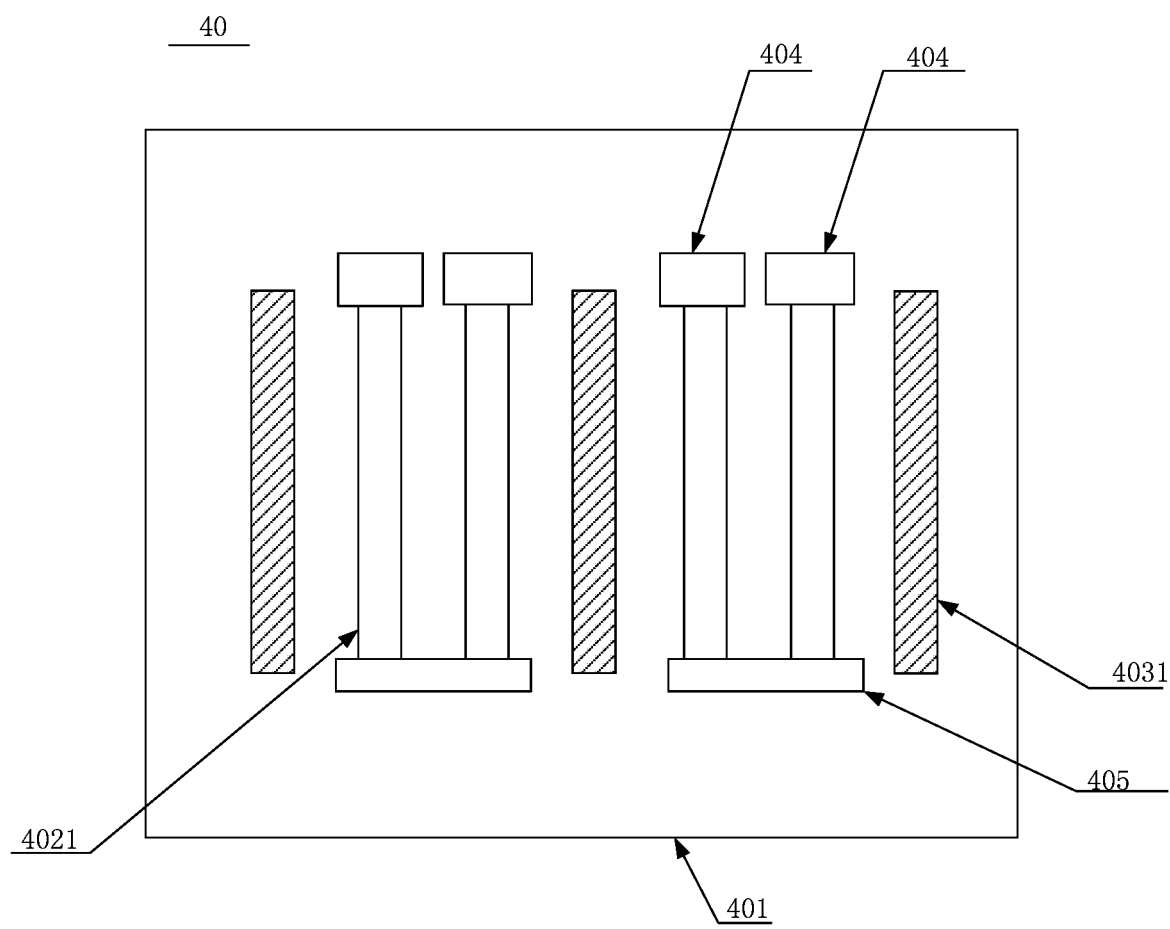
FIG. 11 is a schematic structural diagram illustrating another panel according to an exemplary embodiment of the present disclosure.
Figure 12:
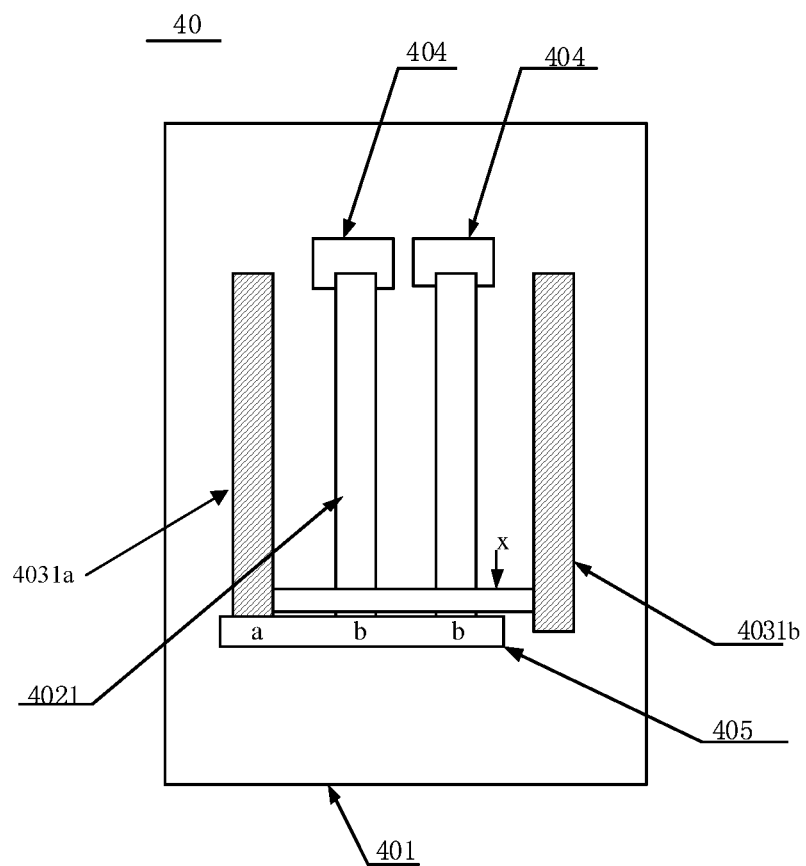
FIG. 12 is a schematic structural diagram illustrating still another panel according to an exemplary embodiment of the present disclosure.
Figure 13:
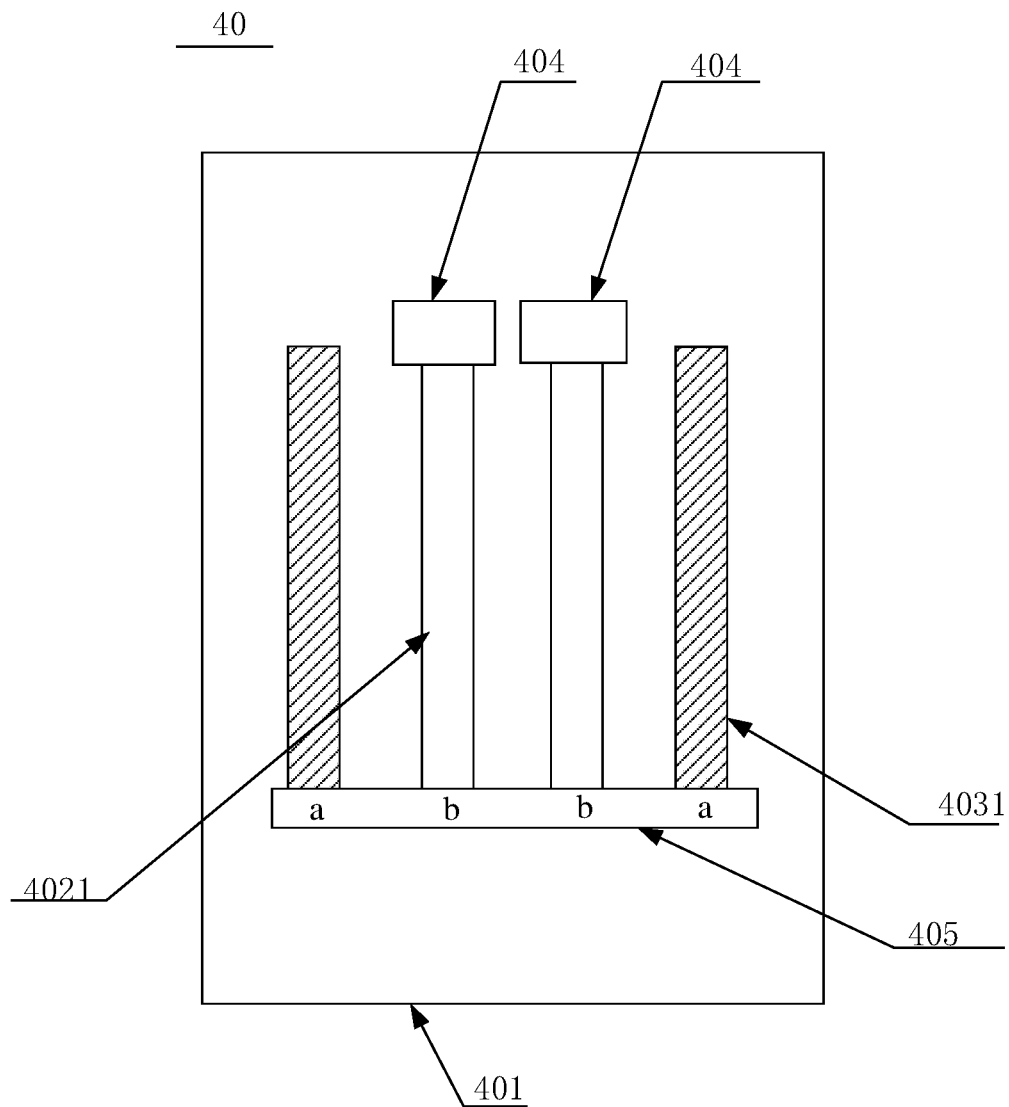
FIG. 13 is a schematic structural diagram illustrating still another panel according to an exemplary embodiment of the present disclosure.

As described above, the panel structures provided in the exemplary embodiments of the present disclosure as describe above may be applicable to various types of panels as long as the differential signal line group is located on the base substrate. The differential signal line group is typically located in the bonding area of the panel, but may also be located in other areas of the panel. To facilitate understanding of the reader, the exemplary embodiments of the present disclosure are described by taking a panel (in which the differential signal line group is located in the bonding area of the panel), which may be a display panel, as an example. As shown in FIGS. 11, 12 and 13, the panel 40 further includes:

at least one bonding terminal 404; and at least one driver chip 405, which, in an exemplary embodiment of the present disclosure, may be a source driver chip.

The at least one bonding terminal 404 and the at least one driver chip 405 are connected through at least one differential signal line group 402 in one-to-one correspondence, and a corresponding ground wire group 403 is arranged between the bonding terminal 404 and the driver chip 405 connected by each differential signal line group 402.

FIGS. 12 and 13 respectively illustrate two implementations of the connection between the ground wires in the ground wire group and the driver chip.

In a first implementation, as shown in FIG. 12, each driver chip 405 has one ground terminal a and two signal terminals b. The ground terminal a is grounded, that is, coupled to a reference ground of the panel. The ground terminal a is located on one side of the two signal terminals b, and the two signal terminals b are configured to be respectively coupled to two signal lines 4021 in a corresponding differential signal line group. In the ground wire group corresponding to the differential signal line group, one ground wire 4031a on the same side of the differential signal line group as the ground terminal is directly coupled to the ground terminal, the other ground wire 4031b on a different side of the differential signal line group than the ground terminal is coupled to the ground terminal a through a lead wire x insulated from both of the two signal lines, and an orthographic projection of the lead wire x on the base substrate 401 intersects orthographic projections of the two signal lines 4021 on the base substrate 401.

In an exemplary embodiment of the present disclosure, the lead wire x is located on a side of the two signal lines 4021 away from the base substrate 401 and lapped on the two signal lines 4021, and an insulating spacer is arranged at a lapping position of the lead wire x and the two signal lines 4021. In this way, it is ensured that the lead wire x does not influence signal transmission on the two signal lines 4021. Alternatively, the lead wire x and the ground wire group 403 are located at different layers, an insulating layer is arranged between the lead wire x and the ground wire group 403, one end of the lead wire x is coupled to an end of one ground wire close to the ground terminal through a via hole in the insulating layer, and the other end of the lead wire x is coupled to an end of the other ground wire close to the ground terminal through another via hole in the insulating layer. FIG. 12 shows a case where the lead wire x is lapped on two signal lines 4021.

In a second implementation, as shown in FIG. 13, each driver chip 405 is provided with two signal terminals b and two ground terminals a. The two ground terminals a are coupled to a same reference ground of the panel. The two ground terminals a are located at two sides of the two signal terminals b, respectively, and the two signal terminals b are configured to be respectively coupled to two signal lines 4021 in a corresponding differential signal line group. In the ground wire group corresponding to the differential signal line group, a ground wire 4031 and a ground terminal a located on the same side of the differential signal line group are directly coupled to each other.

Apparently, the ground wires in the ground wire group may be coupled to the driver chip in other manners besides the above two implementations. For example, in the first implementation above, the driver chip has one ground terminal a, the lead wire x is routed and coupled to the ground terminal a from the other side of the driver chip, and an orthographic projection of the lead wire x on the base substrate 401 does not intersect orthographic projections of the two signal lines 4021 on the base substrate 401.

It should be noted that FIGS. 12 and 13 merely illustrate the position relationship by taking one differential signal line group and one ground wire group as an example. For the position relationship between each differential signal line group and the corresponding ground wire group in practical implementations, reference may be made to FIG. 12 or 13. Apparently, the panel may also be implemented in other manners; for example, a plurality of driver chips may share one ground terminal, which is not described herein.

In FIGS. 11 to 13, one end of the ground wire in the ground wire group, which is far away from the driver chip, may be, or not be, coupled to the reference ground. If the end is coupled to the reference ground, in an implementation, the display panel is provided with a bonding terminal coupled to the reference ground for each ground wire group, and each ground wire group is coupled to the corresponding bonding terminal. The ground wire may be coupled to the bonding terminal directly or through a lead wire, and the lead wire may intersect and be insulated from the differential signal line group, or may not intersect the differential signal line group by bypassing the differential signal line group. In another implementation, the display panel may be provided with bonding terminals in one-to-one correspondence with the ground wires, and the corresponding bonding terminal and ground wire are located on the same side of the differential signal line group and are directly coupled to each other. In yet another implementation, the display panel may be provided with one grounded bonding terminal to which all the ground wires in the ground wire group are connected. In this case, each of the ground wires may be coupled to the bonding terminal directly or through a lead wire, and the lead wire may intersect and be insulated from the differential signal line group, or may not intersect the differential signal line group by bypassing the differential signal line group, which is not limited herein.

For convenience of description, FIGS. 4 to 7 and FIGS. 11 to 13 are schematic structural diagrams of a portion of the panel. In fact, the panel further includes other areas and structures; for example, the panel further includes a display area when the panel is a display panel, which is not limited herein. Further, the two signal lines in each differential signal line group as described above may be arranged in parallel (i.e., having parallel projections on the base substrate), and the two ground wires in the corresponding ground wire group may also be arranged in parallel (i.e., having parallel projections on the base substrate). In actual implementations, however, because it is necessary to avoid other structures, the signal lines in the differential signal line group and the ground wires in the ground wire group may have turns, which is not limited herein.

In summary, in the panel provided in the exemplary embodiment of the present disclosure, at least one ground wire group and at least one differential signal line group are on the base substrate in one-to-one correspondence, each ground wire group includes two ground wires, orthographic projections of the two ground wires in each ground wire group on the base substrate are respectively located on two sides of an orthographic projection of a corresponding differential signal line group on the base substrate, and interference shielding of signals is performed on the differential signal line group by the ground wires, thereby effectively reducing external signal interference, and thus improving signal transmission reliability of the differential signal line group.

According to another aspect of the present disclosure, there is provided a terminal including the panel according to any of the above embodiments of the present disclosure. The terminal may be a mobile phone, a television, an electronic paper, a computer, a digital broadcast terminal, a message transceiver, a game console, a tablet device, a medical device, a fitness device, a personal digital assistant, a display, a laptop, a digital photo frame, a navigator or other devices or components.

Figure 14:
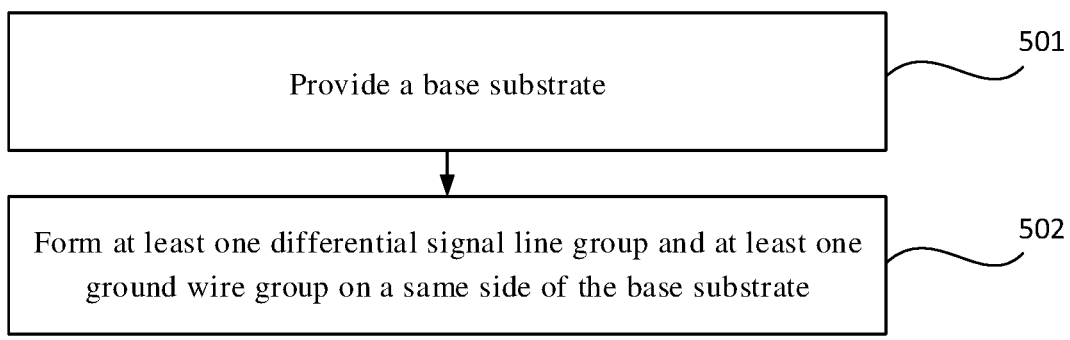
FIG. 14 is a flowchart illustrating a manufacturing method for a panel according to an exemplary embodiment of the present disclosure.

According to still another aspect of the present disclosure, there is provided a manufacturing method for a panel. As shown in FIG. 14, the method includes steps 501 and 502.

At step 501, a base substrate is provided.

In an exemplary embodiment of the present disclosure, the base substrate may be made of a glass or an organic matter.

At step 502, at least one differential signal line group and at least one ground wire group are formed on a same side of the base substrate.

In an exemplary embodiment of the present disclosure, the at least one ground wire group is in one-to-one correspondence with the at least one differential signal line group, each differential signal line group includes two signal lines, each ground wire group includes two ground wires, orthographic projections of the two ground wires in each ground wire group on the base substrate are located on two sides of an orthographic projection of a corresponding differential signal line group on the base substrate.

Step 502 may be implemented in various manners. As described above, the at least one differential signal line group and the at least one ground wire group are located at the same layer on the base substrate.

If the differential signal line group and the ground wire group on the base substrate are not segmented, that is, the signal line arranged on the base substrate is a signal line of a whole segment, and then each ground wire in the corresponding ground wire group is also a whole ground wire. In one case, the two are made of the same material so that a conductive material layer may be formed on the base substrate and undergoes one patterning process to form the at least one differential signal line group and the at least one ground wire group. In another case, the two are made of different materials so that a first conductive material layer may be formed on the base substrate and undergoes one patterning process to form the at least one differential signal line group, and then a second conductive material layer is formed on the base substrate and undergoes one patterning process to form the at least one ground wire group. Alternatively, the second conductive material layer is formed on the base substrate and undergoes one patterning process to form the at least one ground wire group, and then the first conductive material layer is formed on the base substrate and undergoes one patterning process to form the at least one differential signal line group.

If the differential signal line group and the ground wire group on the base substrate are both segmented, for example, the signal line on the base substrate is a signal line having multiple segments located at different layers, then each ground wire in the corresponding ground wire group is also a ground wire having multiple segments at different layers, and the multiple segments of the signal line are in one-to-one correspondence with the multiple segments of the ground wire, and corresponding segments of the signal line and the ground wire are at the same layer. In this case, for the manufacturing methods for the signal line and the ground wire corresponding to each other in each layer, reference may be made to the manufacturing method for the signal line and the ground wire at the same layer as described above.

It should be noted that in the above manufacturing method, the one patterning process may include photoresist coating, exposing, developing, etching, or photoresist stripping.

For the manufacturing methods for other structures of the panel, reference may be made to the manufacturing methods as described above, and for the related structures in the manufacturing method in the exemplary embodiments of the disclosure, reference may be made to the above device embodiments, which are not repeated herein.

It should be noted that in the drawings, sizes of the layers and regions may be exaggerated for clarity of illustration. It will be understood that when an element or layer is referred to as being "on" another element or layer, it may be directly on the other element or layer, or an intervening layer may be present. In addition, it will be understood that when a layer or element is referred to as being "between" two layers or elements, it may be the only layer between the two layers or elements, or more than one intervening layer or element may be present. Like reference numerals refer to like elements throughout the disclosure.

In the manufacturing method for a panel provided in the exemplary embodiment of the present disclosure, at least one ground wire group and at least one differential signal line group are on the base substrate in one-to-one correspondence, each ground wire group includes two ground wires, orthographic projections of the two ground wires in each ground wire group on the base substrate are located on two sides of an orthographic projection of a corresponding differential signal line group on the base substrate, and thus, interference shielding of signals is performed on the differential signal line group by the ground wires, thereby effectively reducing external signal interference, and improving signal transmission reliability of the differential signal line group.

Other implementations of the disclosure will be apparent to those skilled in the art from consideration of the specification and practice of the embodiments disclosed herein. This application is intended to cover any variations, uses, or adaptations of the disclosure which follow general principles of the disclosure and include common knowledge or conventional technical means in the art that are not disclosed herein. The description and embodiments herein are intended to be considered as exemplary only, and the true scope and spirit of the disclosure are defined by the claims.

It should be understood that the present disclosure is not limited to the precise structures as described above and shown in the drawings, and that various modifications and changes may be made without departing from the scope of the present disclosure. The scope of the present disclosure is defined only in the appended claims.

What is claimed is:

1. A panel, comprising:
   a base substrate;
   at least one differential signal line group on the base substrate, each differential signal line group comprising two signal lines; and
   at least one ground wire group on the base substrate and on the same side of the base substrate as the at least one differential signal line group, wherein the at least one ground wire group is in one-to-one correspondence with the at least one differential signal line group, each ground wire group comprises two ground wires, and orthographic projections of the two ground wires in each ground wire group on the base substrate are on two sides of an orthographic projection of a corresponding differential signal line group on the base substrate, respectively,
   wherein a width of each of the two signal lines in each differential signal line group changes along an extending direction of the signal line and satisfies: S/D is a fixed value, where D is a gap width between the two signal lines, and S is the width of each of the two signal lines,
   wherein the panel further comprises at least one bonding terminal; and at least one driver chip, the at least one bonding terminal and the at least one driver chip are connected through the at least one differential signal line group in one-to-one correspondence, and a corresponding ground wire group is arranged between the bonding terminal and the driver chip connected by each differential signal line group,
   each driver chip is provided with one ground terminal and two signal terminals, the ground terminal is at one side of the two signal terminals, the two signal terminals are configured to be coupled to the two signal lines in a corresponding differential signal line group, one ground wire on the same side of the differential signal line group as the ground terminal is directly coupled to the ground terminal, the other ground wire on a different side of the differential signal line group than the ground terminal is coupled to the ground terminal through a lead wire insulated from both of the two signal lines, and an orthographic projection of the lead wire on the base substrate intersects orthographic projections of the two signal lines on the base substrate.

2. The panel according to claim 1, wherein a value of S/D is in the range of $$\left[\frac{F}{2}, \frac{3F}{2}\right],$$

where F is a value greater than 0.1.

3. The panel according to claim 1, wherein
   a distance W between any ground wire and a signal line adjacent to the ground wire satisfies:
   W is less than or equal to 3S,
   where S is a width of the signal line adjacent to the ground wire.

4. The panel according to claim 1, wherein
   the at least one differential signal line group comprises a plurality of differential signal line groups arranged in an array, the at least one ground wire group comprises a plurality of ground wire groups arranged in an array, and any two adjacent ground wire groups share one ground wire.

5. The panel according to claim 1, wherein
   the signal lines in the differential signal line group are linear signal lines, and the ground wires in the ground wire group are linear ground wires.

6. The panel according to claim 1, wherein
   the signal lines in the differential signal line group are zigzag signal lines, and the ground wires in the ground wire group are zigzag ground wires.

7. The panel according to claim 6, wherein
   each signal line in the differential signal line group has a first width S1 at a first segment, a second width S2 at a second segment, and a third width S3 at a third segment in sequence along an overall extending direction of the differential signal line group, wherein the second width S2 is greater than the first width S1 and the third width S3.

8. The panel according to claim 7, wherein
   a width of each of the two signal lines in each differential signal line group satisfies: S1/D1=S2/D2=S3/D3;
   where D1 is a gap width between the two signal lines at the first segment, D2 is a gap width between the two signal lines at the second segment, and D3 is a gap width between the two signal lines at the third segment.

9. The panel according to claim 1, wherein the at least one differential signal line group and the at least one ground wire group are at a same layer on the base substrate.

10. The panel according to claim 1, wherein the signal lines in the at least one differential signal line group are signal lines with adjustable widths.

11. The panel according to claim 1, wherein the lead wire is on a side of the two signal lines away from the base substrate and lapped on the two signal lines, and an insulating spacer is arranged at a lapping position of the lead wire and the two signal lines.

12. The panel according to claim 1, wherein the lead wire and the ground wire group are at different layers, an insulating layer is arranged between the lead wire and the ground wire group, one end of the lead wire is coupled to an end of the one ground wire close to the ground terminal through a via hole in the insulating layer, and the other end of the lead wire is coupled to an end of the other ground wire close to the ground terminal through another via hole in the insulating layer.

13. The panel according to claim 1, wherein each driver chip is provided with two signal terminals and two ground terminals, the two signal terminals are configured to be coupled to the two signal lines in a corresponding differential signal line group, respectively, and the two ground terminals are at two sides of the two signal terminals, respectively, and in the ground wire group corresponding to the differential signal line group, a ground wire and a ground terminal on a same side of the differential signal line group are directly coupled to each other.

14. The panel according to claim 1, wherein an overall extending direction of each ground wire group coincides with an overall extending direction of a corresponding differential signal line group.

15. The panel according to claim 1, wherein the panel is one of a display panel, a touch panel and an in-cell touch display panel.

16. A terminal, comprising the panel according to claim 1.

17. A manufacturing method for a panel, comprising: providing a base substrate; and forming at least one differential signal line group and at least one ground wire group on a same side of the base substrate, wherein the at least one ground wire group is in one-to-one correspondence with the at least one differential signal line group, each differential signal line group comprises two signal lines, each ground wire group comprises two ground wires, and orthographic projections of the two ground wires in each ground wire group on the base substrate are on two sides of an orthographic projection of a corresponding differential signal line group on the base substrate, respectively, wherein a width of each of the two signal lines in each differential signal line group changes along an extending direction of the signal line and satisfies: S/D is a fixed value, where D is a gap width between the two signal lines, and S is the width of each of the two signal lines, wherein the panel further comprises at least one bonding terminal; and at least one driver chip, the at least one bonding terminal and the at least one driver chip are connected through the at least one differential signal line group in one-to-one correspondence, and a corresponding ground wire group is arranged between the bonding terminal and the driver chip connected by each differential signal line group, each driver chip is provided with one ground terminal and two signal terminals, the ground terminal is at one side of the two signal terminals, the two signal terminals are configured to be coupled to the two signal lines in a corresponding differential signal line group, respectively, and in the ground wire group corresponding to the differential signal line group, one ground wire on the same side of the differential signal line group as the ground terminal is directly coupled to the ground terminal, the other ground wire on a different side of the differential signal line group than the ground terminal is coupled to the ground terminal through a lead wire insulated from both of the two signal lines, and an orthographic projection of the lead wire on the base substrate intersects orthographic projections of the two signal lines on the base substrate.

* * * * *